United States Patent [19]
Tseng

[11] Patent Number: 5,710,075
[45] Date of Patent: Jan. 20, 1998

[54] METHOD TO INCREASE SURFACE AREA OF A STORAGE NODE ELECTRODE, OF AN STC STRUCTURE, FOR DRAM DEVICES

[75] Inventor: Horng-Huei Tseng, Hsinchu, Taiwan

[73] Assignee: Vanguard International Semiconductor Corporation, Hsin-chu, Taiwan

[21] Appl. No.: 746,030

[22] Filed: Nov. 6, 1996

[51] Int. Cl.⁶ .............................................. H01L 21/8242
[52] U.S. Cl. .................................... 438/254; 438/596
[58] Field of Search ........................... 438/253, 254, 438/256, 396, 397, 399, 595, 596, 657

[56] References Cited

U.S. PATENT DOCUMENTS

| | | | |
|---|---|---|---|
| 5,137,842 | 8/1992 | Chan et al. | 438/254 |
| 5,290,729 | 3/1994 | Hayashide et al. | 438/256 |
| 5,447,882 | 9/1995 | Kim | 438/396 |
| 5,491,103 | 2/1996 | Ahn et al. | 438/397 |

*Primary Examiner*—Chandra Chaudhari
*Attorney, Agent, or Firm*—George O. Saile; Stephen B. Ackerman

[57] ABSTRACT

A method of creating an STC structure, used for high density, DRAM designs, has been developed. The process consists of creating a lower, or storage node electrode, for the STC structure, consisting of a flat, lower polysilicon shape, contacting an underlying transistor region, and of an upper polysilicon shape, comprised of polysilicon spacers, on the sides of the lower polysilicon shape, protruding above the top surface of the flat, lower polysilicon shape. The polysilicon spacers are formed via LPCVD and anisotropic RIE procedures, in addition to the use of a lift off procedure, used to remove unwanted polysilicon spacers from an underlying silicon oxide surface. This storage node configuration results in an significant increase of surface area, when compared to storage nodes fabricated without the incorporation of polysilicon spacers.

31 Claims, 8 Drawing Sheets

METHOD TO INCREASE SURFACE AREA OF A STORAGE NODE ELECTRODE, OF AN STC STRUCTURE, FOR DRAM DEVICES

BACKGROUND OF THE INVENTION (1) Field of the Invention

The present invention relates to a method used to fabricate high density, semiconductor, DRAM cells, and more specifically to a process used to increase the surface area, and the accompanying capacitance of an STC component of the DRAM cell, via the use of a novel storage node electrode configuration.

(2) Description of the Prior Art

The objectives of the semiconductor industry are to continually improve device performance, while still attempting to decrease the manufacturing cost of specific semiconductor chips. These objectives have been in part realized by the ability of the semiconductor industry to produce chips with sub-micron features, or micro-miniaturization. Smaller features allow the reduction in performance degrading capacitances and resistances to be realized. In addition smaller features result in a smaller chip, however possessing the same level of integration obtained for semiconductor chips fabricated with larger features. This allows a greater number of the denser, smaller chips to be obtained from a specific size starting substrate, thus resulting in a lower manufacturing cost for an individual chip.

The use of smaller features, when used for the fabrication of dynamic random access memory, (DRAM), devices, in which the capacitor of the DRAM device is a stacked capacitor, (STC), structure, presents difficulties when attempting to increase STC capacitance. A DRAM cell is usually comprised of the STC structure, overlying a transfer gate transistor, and connected to the source of the transfer gate transistor. However the decreasing size of the transfer gate transistor, limits the dimensions of the STC structure. To increase the capacitance of the STC structure, comprised of two electrodes, separated by a dielectric layer, either the thickness of the dielectric layer has to be decreased, or the area of the capacitor has to be increased. The reduction in dielectric thickness is limited by increasing reliability and yield risks, encountered with ultra thin dielectric layers In addition the area of the STC structure is limited by the area of the underlying transfer gate transistor dimensions. The advancement of the DRAM technology to densities of 256 million cells per chip, or greater, has resulted in a specific cell in which a smaller transfer gate transistor is being used, resulting in less of an overlying area for placement of overlying STC structures.

One method of maintaining, or increasing STC capacitance, while still decreasing the lateral dimension of the capacitor, has been the use of rough, or hemispherical grained, (HSG), polysilicon layers. Hayashide, in U.S. Pat. No. 5,290,729, describes a storage node, or lower electrode, of an STC structure, in which the surface area of the lower electrode is increased via growth of HSG polysilicon, on the top surface of the lower electrode. However the HSG polysilicon process can be difficult to control, based on the narrow range of deposition and anneal conditions, needed to obtain the desired HSG characteristics. Another method used for achieving the desired electrode surface area is the creation of the lower electrodes with pillars, or protruding shapes of polysilicon, thus resulting in a greater electrode surface area then would have been achieved with conventional flat surfaces. Kim, in U.S. Pat. No. 5,447,882, describes such an STC structure, comprised of a lower electrode, formed by creating protruding polysilicon features, via patterning of a polysilicon layer. However for the Kim invention, the protruding polysilicon shapes, of the lower electrode, are limited by the thickness of the polysilicon layer, thus limiting the resulting increase in capacitance.

This invention will describe a process in which a storage node electrode, or lower electrode of an STC structure is fabricated using protruding polysilicon spacers or columns, created via use of oxide spacers, polysilicon spacers, and a oxide lift-off process, resulting in a storage node electrode of an STC structure, capable of providing surface areas greater then surface areas that can be obtained from counterparts, fabricated without the use of this invention.

SUMMARY OF THE INVENTION

It is an object of this invention to create a DRAM device, with an STC structure, in which the surface area of the storage node electrode, of the STC structure is increased, without increasing the width of the STC structure.

It is another object of this invention to form the storage node electrode, of the STC structure, in two segments, a flat, lower segment, contacting a region of an underlying transfer gate transistor, and an upper segment, comprised of polysilicon columns, or spacers, overlying the lower segment of the storage node electrode, and extending upwards.

It is yet another object of this invention to create the polysilicon columns or spacers, directly on the flat, lower segment of the storage node electrode, via creation of polysilicon spacers, on the sides of silicon oxide spacers, followed by removal of the silicon oxide spacers, and removal of the unwanted polysilicon spacers, that are not electrically connected to the lower segment of the storage node electrode, via a lift-off procedure, using a wet etchant.

In accordance with the present invention a method for fabricating increased capacitance DRAM devices, via use of an STC structure, comprised of a storage node electrode with increased surface area, has been developed. Transfer gate transistors comprised of: a thin gate insulator; polysilicon gate structures, formed from a first polysilicon layer; lightly doped source and drain regions; insulator spacers on the sidewalls of the polysilicon gate structure; and heavily doped source and drain regions; are formed on a semiconductor substrate. A composite insulator layer, comprised of an underlying silicon oxide layer, and a thin, overlying, first silicon nitride layer, is deposited, planarized, then followed by a contact hole opening in the composite insulator layer, made to expose the source and drain regions of adjacent transfer gate transistors. A second polysilicon layer is deposited, completely filling the contact hole opening, and contacting the source and drain regions of the transfer gate transistors. The second polysilicon layer also overlies the composite insulator layer, in regions outside the contact hole opening. A second silicon nitride layer is deposited on the second polysilicon layer. Photolithographic patterning, and dry etching procedures, are then used to create an electrode opening, in the second silicon nitride layer, with the opening extending into a top portion of the second polysilicon layer, defining the width of a lower segment of the storage node electrode structure. Another insulator layer is deposited, followed by a selective, anisotropic dry etch procedure, and used to create insulator spacers on the sides of the electrode opening. A thermal oxidation is next performed to grow a silicon oxide plug, on the surface of the second polysilicon layer, exposed between insulator spacers, in the electrode opening. After removal of the second silicon nitride layer, a selective, anisotropic dry etch procedure is employed, to remove the second polysilicon layer from all regions not protected by either insulator spacers, or silicon oxide plugs, resulting in the creation of a flat, lower segment, of the storage node electrode, which is comprised of a second polysilicon shape, equal in width to the width of the electrode opening, with overlying insulator spacers, and an overlying silicon oxide plug, between insulator spacers. A third polysilicon layer is deposited, again followed by a selective, anisotropic dry etch procedure, creating polysilicon spacers on the exterior sides of the insulator spacers, overlying the first silicon nitride layer, and also creating polysilicon spacers on the inner sides of the insulator spacers, overlying the silicon oxide plug. A wet etch is then used to remove the insulator spacers and the silicon oxide plugs, lifting off the polysilicon spacers residing on the underlying silicon oxide plug, and resulting in the creation of the upper segment of the storage node electrode, comprised of polysilicon spacers, overlying the first silicon nitride layer, with the lower portion of the polysilicon spacers contacting the sides of the lower segment of the storage node electrode. A capacitor dielectric layer is next formed on the storage node electrode structure, followed by the creation of an upper electrode, or plate electrode structure, completing the processing of the STC structure.

BRIEF DESCRIPTION OF THE DRAWINGS

The object and other advantages of this invention are best explained in the preferred embodiment with reference to the attached drawings that include.

DESCRIPTION OF THE PREFERRED EMBODIMENTS

The method of forming a DRAM device, with increased capacitance, resulting from the use of a STC structure that features a storage node electrode, comprised of polysilicon spacers, fabricated via the use of insulator and polysilicon spacers, and a insulator lift-off process, will now be described. The transfer gate transistor, used for this DRAM device, in this invention, will be an N channel device. However the STC structure, with the increased surface area described in this invention, can also be applied to P channel, transfer gate transistor.

Figure 1:
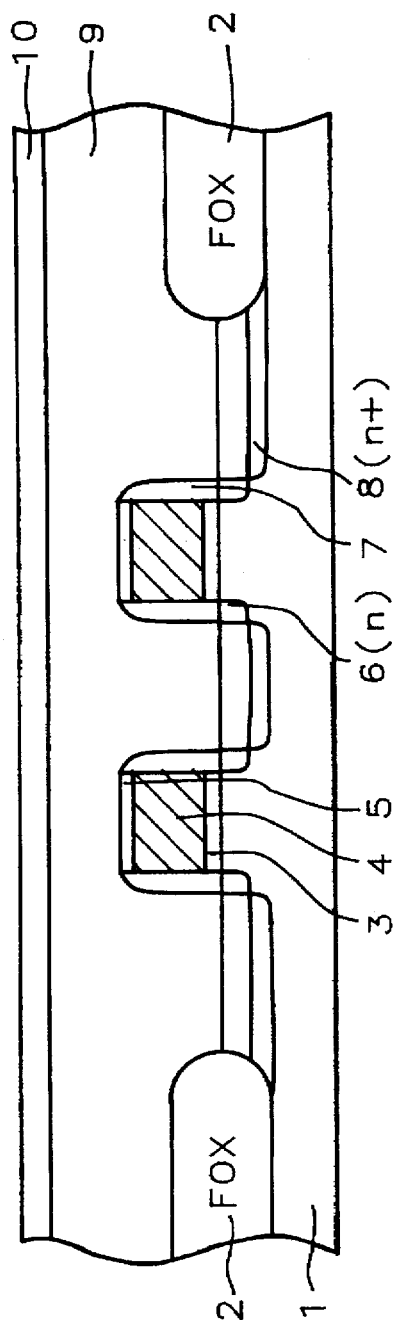
FIGS. 1–9, which schematically shows, in cross-sectional style, the key fabrication stages used in the creation of a DRAM device, with a STC structure, with an increased surface area, resulting from a storage node electrode structure comprised of polysilicon spacers, or columns, on a flat, lower polysilicon shape.

Referring to FIG. 1, a P type, semiconductor substrate, 1, with a <100>, single crystalline orientation, is used. Field oxide, (FOX), regions, 2, are used for purposes of isolation. Briefly the FOX regions, 2, are formed via thermal oxidation, in an oxygen-steam ambient, at a temperature between about 850° to 1050° C., to a thickness between about 3000 to 5000 Angstroms. A patterned oxidation resistant mask of silicon nitride-silicon oxide is used to prevent FOX regions, 2, from growing on areas of substrate, 1, to be used for subsequent device regions. After the growth of the FOX regions, 2, the oxidation resistant mask is removed via use of a hot phosphoric acid solution for the overlying, silicon nitride layer, and a buffered hydrofluoric acid solution for the underlying silicon oxide layer. After a series of wet cleans, a gate insulator layer, 3, of silicon oxide is thermally grown in an oxygen-steam ambient, at a temperature between about 850° to 1050° C., to a thickness between about 50 to 200 Angstroms. A first polysilicon layer, 4, is next deposited using low pressure chemical vapor deposition, (LPCVD), procedures, at a temperature between about 500° to 700° C., to a thickness between about 1500 to 4000 Angstroms. The polysilicon can either be grown intrinsically and doped via ion implantation of arsenic or phosphorous, at an energy between about 30 to 80 KeV, at a dose between about 1E13 to 1E16 atoms/cm$^2$, or grown using in situ doping procedures, via the incorporation of either arsine or phosphine to the silane ambient. A first silicon oxide layer, 5, used as a cap insulator layer, is next grown via the use of either LPCVD or plasma enhanced chemical vapor deposition, (PECVD), procedures, to a thickness between about 600 to 1500 Angstroms. Conventional photolithographic and reactive ion etching, (RIE), procedures using CHF$_3$ as an etchant for silicon oxide layer, 5 and using Cl$_2$ as an etchant for polysilicon layer, 4, are used to create the polysilicon gate structures, 4, with overlying cap insulator layer, 5, shown schematically in FIG. 1. Photoresist removal is accomplished via plasma oxygen ashing and careful wet cleans.

A lightly doped source and drain region, 6, is next formed via ion implantation of phosphorous, at an energy between about 20 to 50 KeV, at a dose between about 1E13 to 1E14 atoms/cm$^2$. A second insulator layer of silicon oxide is then deposited using either LPCVD or PECVD procedures, at a temperature between about 400° to 700° C., to a thickness between about 1500 to 4000 Angstroms, followed by an anisotropic RIE procedure, using CHF$_3$ as an etchant, creating insulator spacer, 7, on the sidewalls of polysilicon gate structures, 4. A heavily doped source and drain region, 8, is then formed via ion implantation of arsenic, at an energy between about 30 to 100 KeV, at a dose between about 1E14 to 5E16 atoms/cm$^2$. The result of these procedures are schematically shown in FIG. 1. A third insulator layer of silicon oxide, 9, is next deposited using LPCVD or PECVD procedures, at a temperature between about 400° to 700° C., to a thickness between about 3000 to 8000 Angstroms. Silicon oxide layer, 9, is planarized using chemical mechanical polishing, to provide a smoother surface for subsequent depositions and patterning procedures. A deposition of a first silicon nitride layer, 10, is then performed at a temperature between about 700° to 750° C., and to a thickness between about 500 to 1500 Angstroms. The result of these depositions are schematically shown in FIG. 1.

Figure 2:
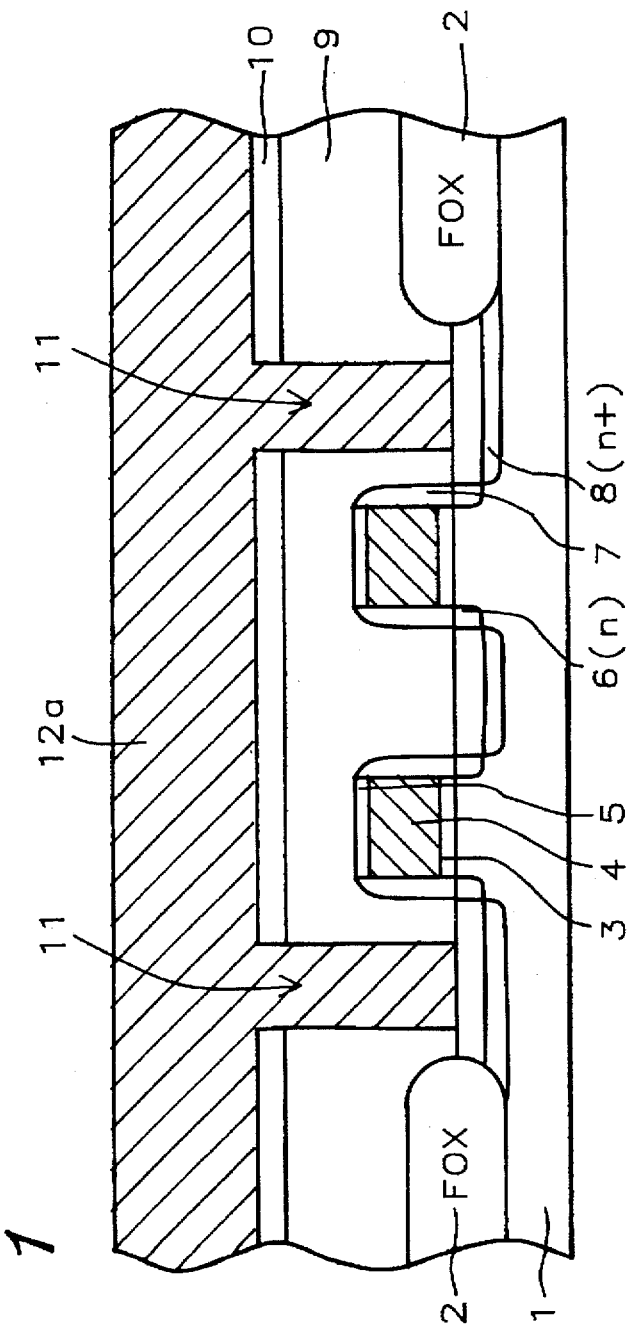

Conventional photolithographic and RIE procedures, using CHF$_3$ as an etchant, are used to open contact hole, 11, in silicon nitride layer, 10, and silicon oxide layer, 9, exposing the top surface of heavily doped source and drain region, 8, shown schematically in FIG. 2. Photoresist removal is performed via use of plasma oxygen ashing and careful wet cleans. A second layer of polysilicon layer of, 12a, is next deposited, via LPCVD procedures, at a temperature between about 500° to 700° C., to a thickness between about 4000 to 8000 Angstroms. Polysilicon layer, 12a, can be deposited intrinsically and doped via ion implantation of either phosphorous or arsenic, or polysilicon layer, 12a, can be deposited using in situ doping procedures, via the addition of either phosphine or arsine, to a silane ambient. Polysilicon layer, 12a, shown schematically in FIG. 2, contacts the heavily doped source and drain regions, 8, of the underlying transfer gate transistors.

Figure 3:
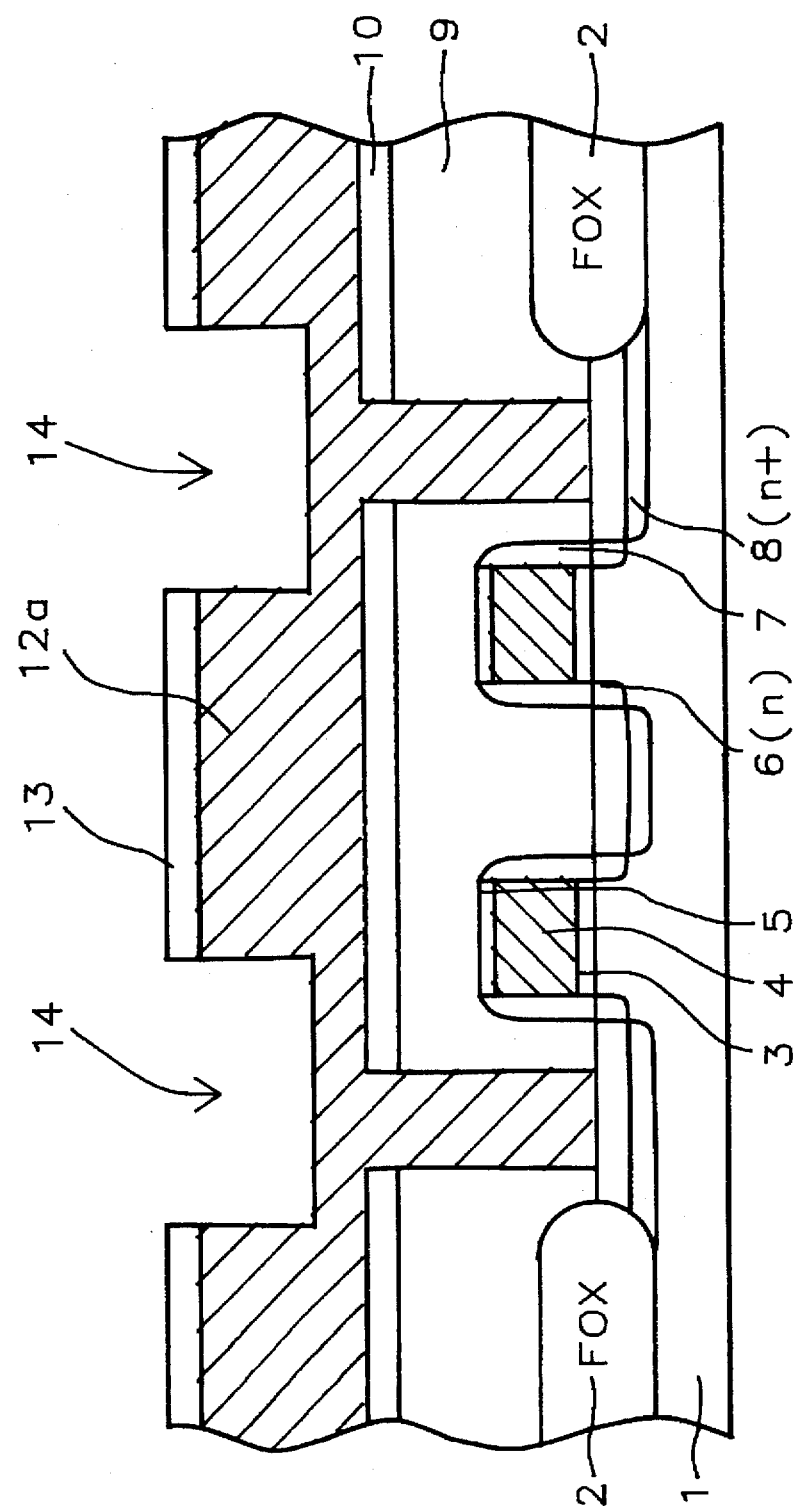

A second layer of silicon nitride, 13, is next deposited using either LPCVD or plasma enhanced chemical vapor deposition, (PECVD), procedures, at a temperature between about 700° to 750° C., to a thickness between about 500 to 1500 Angstroms. A photolithographic procedure, as well as a RIE procedure, using CHF$_3$ as an etchant for silicon nitride layer, 13, and Cl$_2$ as an etchant for a top portion of polysilicon layer, 12a, between about 2000 to 6000 Angstroms, are employed to form electrode opening, 14, shown schematically on FIG. 3. This procedure defines the width of the lower segment of the storage node electrode, of a subsequent STC structure. Photoresist removal is accomplished via plasma oxygen ashing and careful wet cleans.

Figure 4:
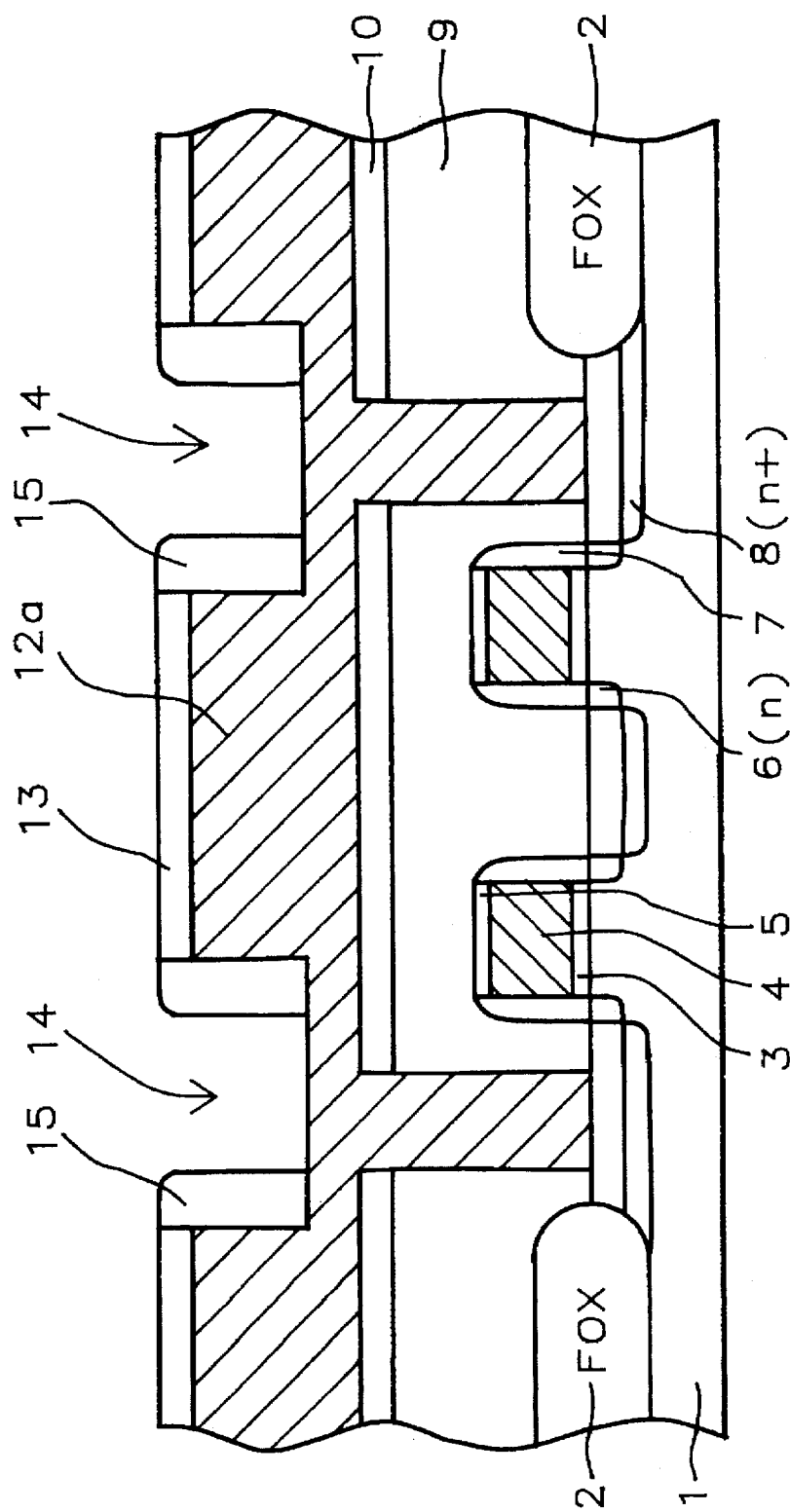

A fourth insulator layer of silicon oxide is next deposited via either LPCVD or PECVD procedures, at a temperature between about 700° to 750° C., to a thickness between about 800 to 2500 Angstroms, followed by a selective, anisotropic RIE procedure, using CHF$_3$ as an etchant, to create insulator spacers, 15, on the inside walls of electrode opening, 14. This is shown schematically in FIG. 4. A silicon oxide plug, 16, is then formed on polysilicon layer, 12a, exposed between insulator spacers, 15, on the inside walls of electrode opening, 14. Silicon oxide plugs, 16, are formed via thermal oxidation, in an oxygen—steam ambient, at a temperature between about 800° to 900° C., to a thickness between about 300 to 1000 Angstroms. This is illustrated schematically in FIG. 5.

Figure 5:
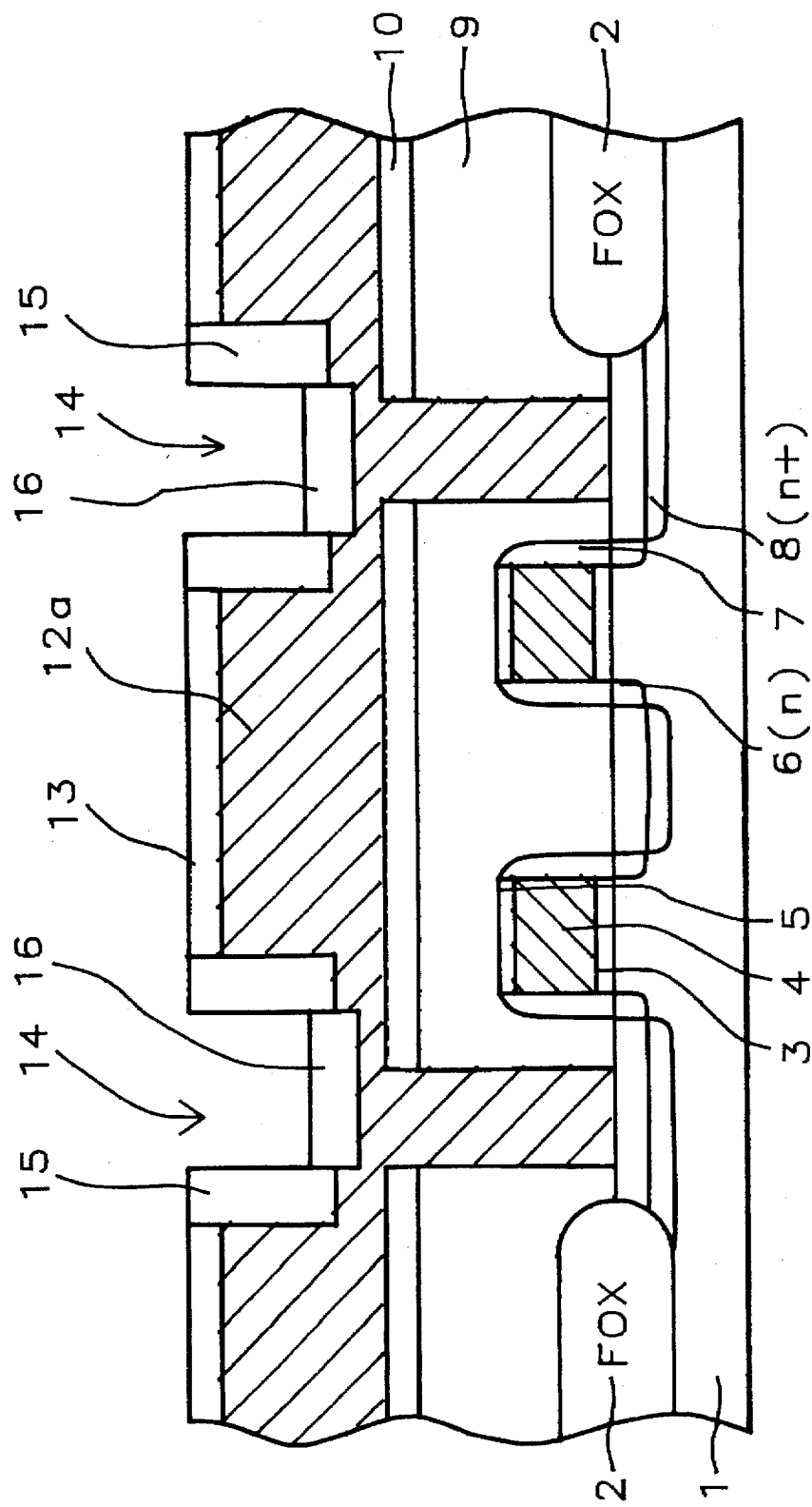
Figure 6:
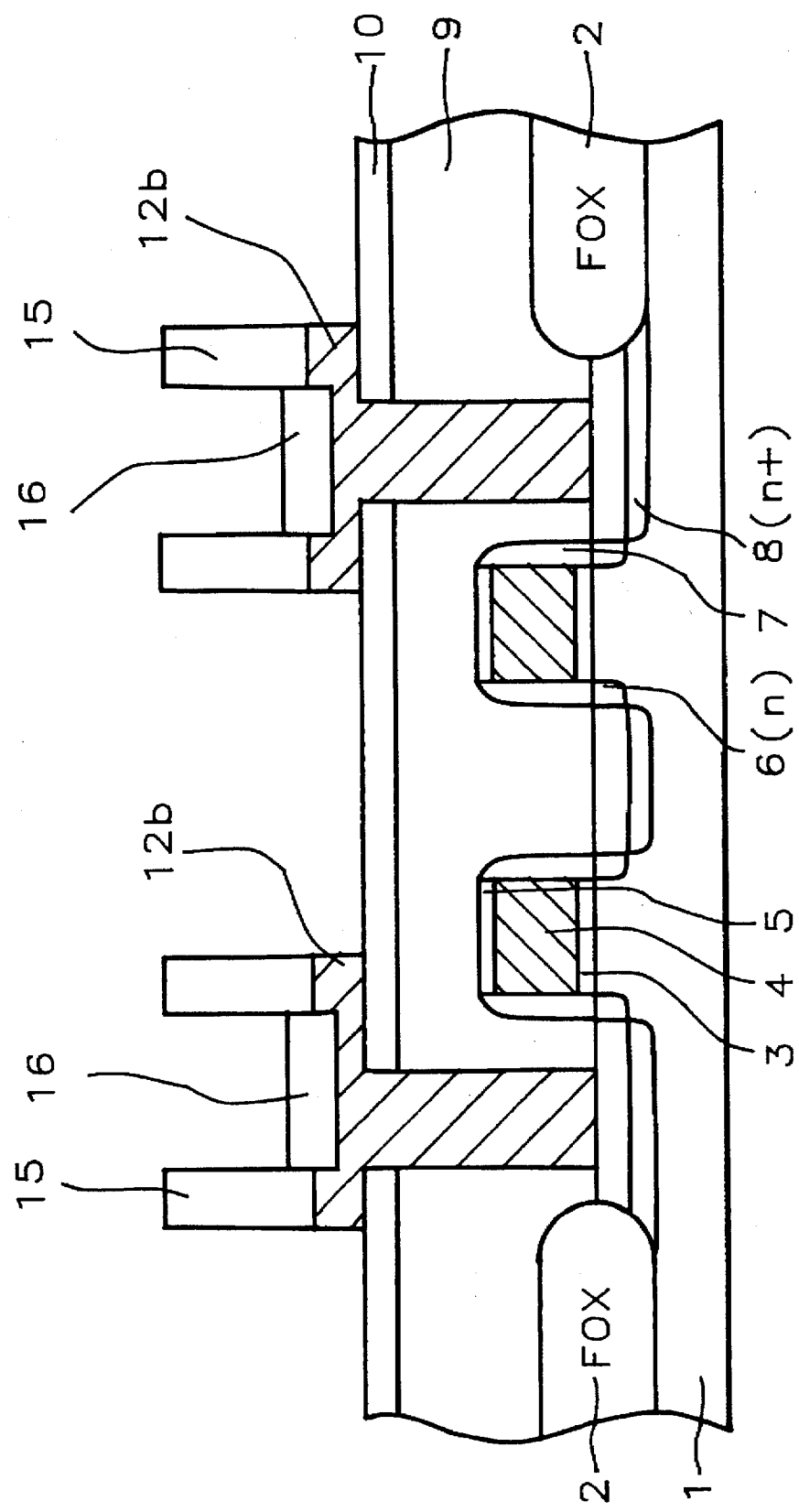

The structure shown in FIG. 5, is next subjected to a hot phosphoric acid solution as an etchant, at a temperature between about 140° to 180° C., to remove silicon nitride layer, 13, exposing polysilicon layer, 12a, for regions in which electrode opening, 14, does not exist. Next another selective, anisotropic RIE procedure, using Cl$_2$ as an etchant, is used to completely remove polysilicon layer, 12a, from areas not covered by insulator spacers, 15, or silicon oxide plugs, 16, creating polysilicon shape, 12b, forming the lower segment of a subsequent storage node electrode, shown schematically in FIG. 6. Another option is to use an anisotropic, RIE procedure, using Cl$_2$—HBr—SF$_6$, as etchants, to remove silicon nitride layer, 13, and pattern polysilicon layer, 12a, creating the lower segment of the subsequent storage node electrode, shown schematically in FIG. 6.

Figure 7:
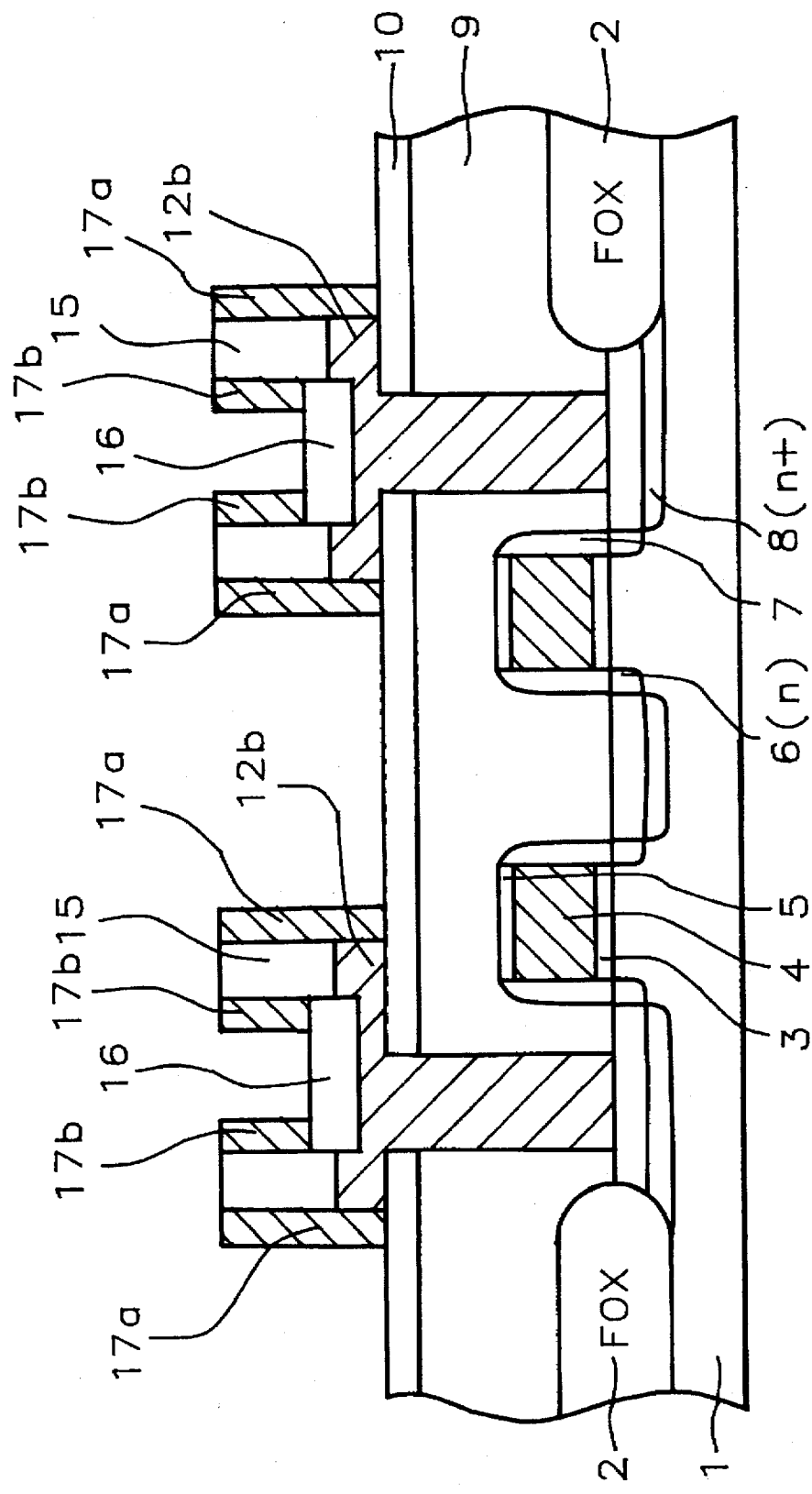
Figure 8:
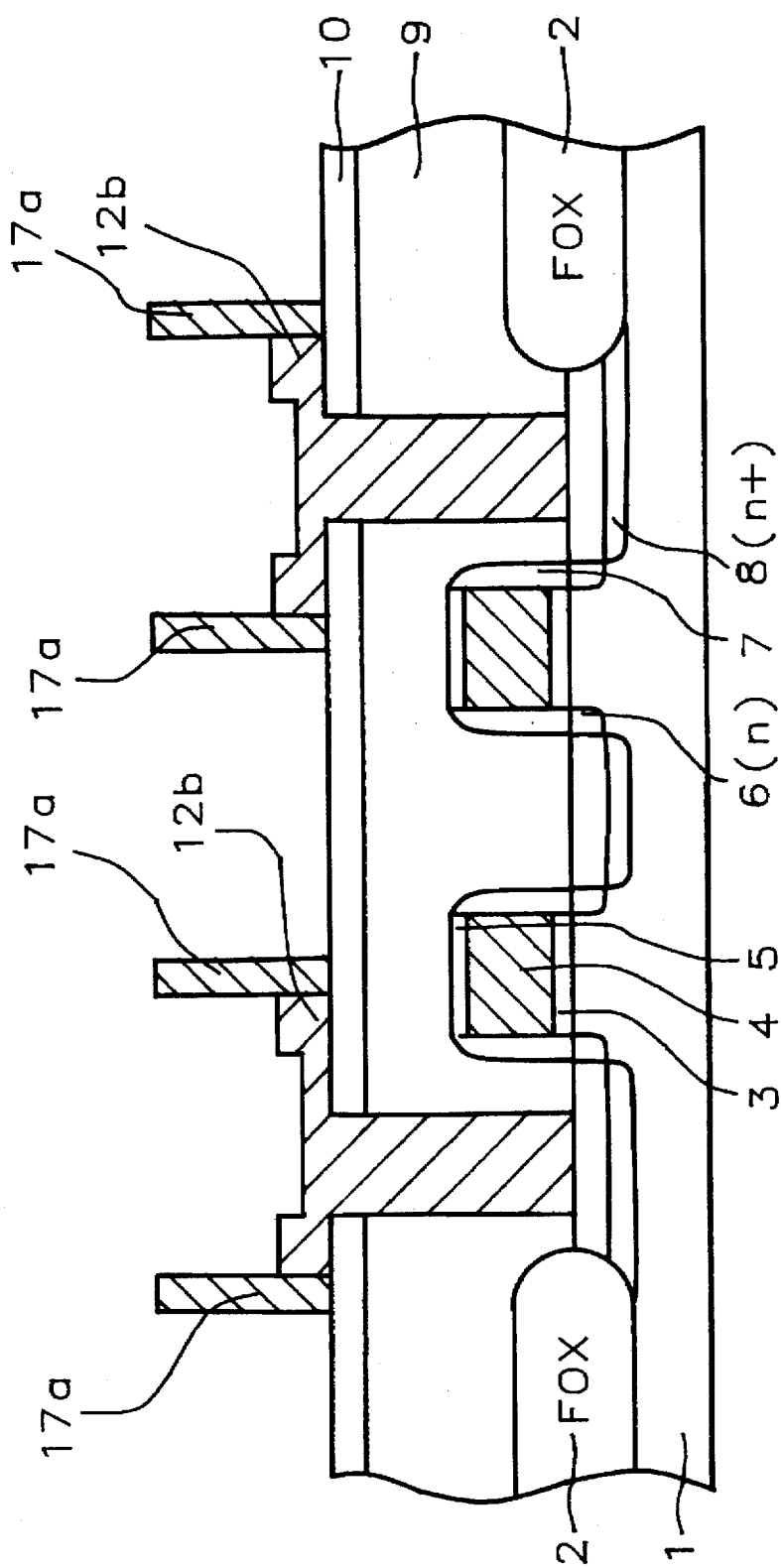

A third layer of polysilicon is next deposited, using LPCVD procedures, at a temperature between about 500° to 700° C., to a thickness between about 500 to 2000 Angstroms, again doped via in situ doping procedures, by addition of phosphine to a silane ambient. An anisotropic RIE procedure, using Cl$_2$ as an etchant is next employed to create polysilicon spacers, 17a, on the outside walls of insulator spacers, 15, overlying silicon nitride layer, 10, as well as polysilicon spacers, 17b, on the inside walls of insulator spacer, 15, overlying silicon oxide plug, 16. This is shown schematically in FIG. 7. A critical aspect of this invention is next addressed by the removal of insulator spacers, 15, as well as the removal of silicon oxide plugs, 16. This is accomplished using a dilute, or buffered hydrofluoric acid solution, or via use of a dry hydrofluoric vapor etch. With either procedure the complete removal of insulator spacers, 15, as well as silicon oxide plugs 16 are accomplished, including the removal of unwanted polysilicon spacers, 17b, lifted off during the removal of silicon oxide plugs 16. This is illustrated schematically in FIG. 8 Polysilicon spacers, or polysilicon columns, 17a, comprise the upper segment of the storage node electrode, overlying the lower segment, which is comprised of polysilicon shape, 12b. The height of the remaining polysilicon spacers or polysilicon columns 17a, which will be responsible for the STC surface area increase, thus the capacitance increase, is therefore equal to the original thickness of polysilicon layer, 12a. Therefore if a greater increase in capacitance is desired the thickness of polysilicon layer, 12a, can be increased. This invention increases the surface area of the storage node electrode, when compared to counterparts fabricated with flat storage node configurations.

Figure 9:
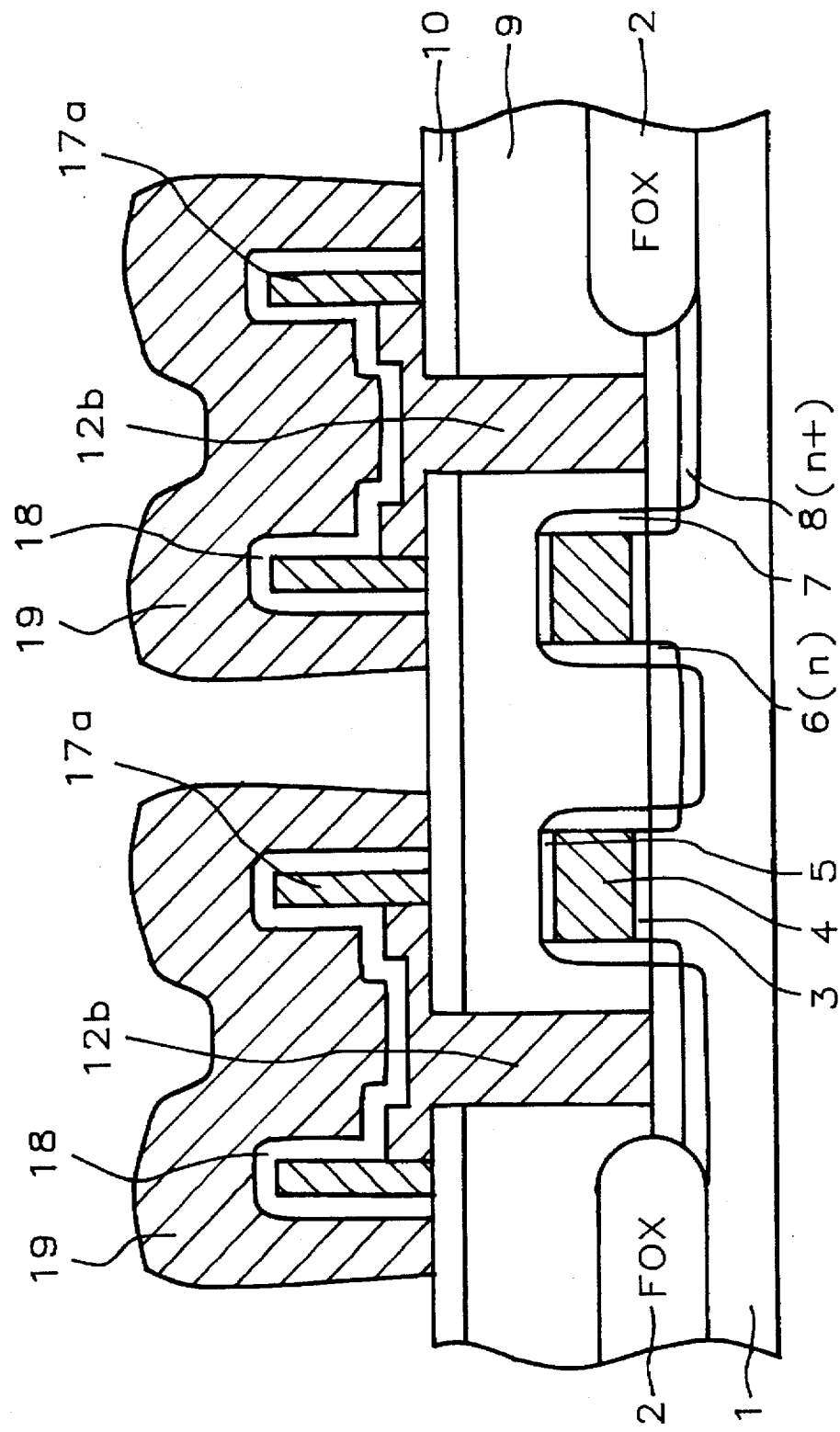

FIG. 9, schematically shows the completion of the STC structure. First a dielectric layer, 18, is formed, overlying the storage node electrode, comprised of polysilicon spacers, 17a, and polysilicon shape, 12b. Dielectric layer, 18, can be an insulator layer possessing a high dielectric constant, such as Ta$_2$O$_5$, obtained via r.f sputtering techniques, at a thickness between about 10 to 100 Angstroms. Dielectric layer, 18, can also be ONO, (Oxidized-silicon Nitride-silicon Oxide). The ONO layer is formed by initially growing a silicon dioxide layer, between about 10 to 50 Angstroms, followed by the deposition of a silicon nitride layer, between about 10 to 20 Angstroms. Subsequent thermal oxidation of the silicon nitride layer results in the formation of a silicon oxynitride layer on silicon oxide, at a silicon oxide equivalent thickness of between about 40 to 80 Angstroms. Finally another layer of polysilicon is deposited, via LPCVD procedures, at a temperature between about 500° to 700° C., to a thickness between about 1000 to 2000 Angstroms. Doping of this polysilicon layer is accomplished via an situ doping deposition procedure, by the addition of phosphine, to the silane ambient. Photolithographic and RIE procedures, using Cl$_2$ as an etchant, are next employed to create polysilicon upper electrode, or plate electrode, 19, shown schematically in FIG. 9. Photoresist is again removed via plasma oxygen ashing and careful wet cleans.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a DRAM device, on a semiconductor substrate, comprised of underlying transistors; with gate insulators, gate electrode structures, formed from a first silicon oxide, and a first polysilicon layer, insulator sidewall spacers, formed from a second silicon oxide layer, and source and drain regions, and an overlying STC structure; with a storage node electrode, a dielectric layer, and an overlying plate electrode, and with said storage node electrode, comprised of a lower polysilicon shape, contacting said source and drain regions of said underlying transistor, and with polysilicon spacers, protruding above the top surface of said lower polysilicon shape, comprising the steps of:

depositing third silicon oxide layer, on said underlying transistor of said DRAM device;

depositing a first silicon nitride layer on said third silicon oxide layer;

opening a contact hole, in said first silicon nitride layer, and in said third silicon oxide layer, to expose top surface of said source and drain regions, of said underlying transistor;

depositing a second polysilicon layer on top surface of said first silicon nitride layer, and on top surface of said source and drain regions, exposed in said contact hole;

depositing a second silicon nitride layer on said second polysilicon layer;

patterning to create a electrode opening in said second silicon nitride layer, and in a top portion of said second polysilicon layer;

depositing a fourth silicon oxide layer on the top surface of said second silicon nitride layer, and on the exposed surfaces of said electrode opening;

anisotropic etching of said fourth silicon oxide layer, to form silicon oxide spacers on the sides of said second polysilicon layer, exposed in said electrode opening;

growing a silicon oxide plug, on surface of said second polysilicon layer, exposed between silicon oxide spacers, in said electrode opening;

removal of said second silicon nitride layer from the top surface of said second polysilicon layer, exposing said second polysilicon layer in regions not covered by said silicon oxide spacers, or by said silicon oxide plugs;

anisotropic etching of said second polysilicon layer, in regions not covered by said silicon oxide spacers, or silicon oxide plugs, creating said lower polysilicon shape, of said storage node electrode, with said silicon oxide spacers, and said silicon oxide plug, between said silicon oxide spacers, on said lower polysilicon shape;

depositing a third polysilicon layer on said silicon oxide spacers, on said silicon oxide plug, between said silicon oxide spacers, and on second silicon nitride layer between said lower polysilicon shapes;

anisotropic etching of said third polysilicon layer, to form said polysilicon spacers, overlying said first silicon nitride layer, on the exterior sides of said silicon oxide spacers, and forming polysilicon spacers, overlying said silicon oxide plug, on the interior sides of said silicon oxide spacers;

isotropic removal of said silicon oxide spacers, and of said silicon oxide plugs, also lifting off said polysilicon spacers that overlaid said silicon oxide plug, forming said storage node electrode, comprised of said lower polysilicon shape, and said polysilicon spacers, on the sides of said lower polysilicon shape, and protruding above, said lower polysilicon shape;

forming said dielectric layer on said storage node electrode;

depositing a fourth polysilicon layer on said dielectric layer; and patterning of said fourth polysilicon layer to form said plate electrode, of said STC structure.

2. The method of claim 1, wherein said second polysilicon layer is deposited using LPCVD procedures, at a temperature between about 500° to 700° C., to a thickness between about 4000 to 8000 Angstroms.

3. The method of claim 1, wherein said second silicon nitride layer is deposited using either LPCVD or PECVD procedures, at a temperature between about 700° to 750° C., to a thickness between about 500 to 1500 Angstroms.

4. The method of claim 1, wherein said electrode opening is formed via RIE processing of said second silicon nitride layer using $CHF_3$ as an etchant, then using $Cl_2$ as an etchant to RIE between about 2000 to 6000 Angstroms, of said second polysilicon layer.

5. The method of claim 1, wherein said fourth silicon oxide layer is deposited using LPCVD or PECVD procedures, at a temperature between about 700° to 750° C., to a thickness between about 800 to 2500 Angstroms.

6. The method of claim 1, wherein said silicon oxide spacers are formed via anisotropic RIE, of said fourth silicon oxide layer, using $CHF_3$ as an etchant.

7. The method of claim 1, wherein said silicon oxide plug is formed via thermal oxidation procedures, in an oxygen-steam ambient, at a temperature between about 800° to 900° C., to a thickness between about 300 to 1000 Angstroms.

8. The method of claim 1, wherein said second silicon nitride layer is removed using a hot phosphoric acid solution, at a temperature between about 140° to 180° C.

9. The method of claim 1, wherein said lower polysilicon shape, of said storage node electrode, is formed via anisotropic, RIE of said second polysilicon layer, using $Cl_2$ as an etchant.

10. The method of claim 1, wherein said third polysilicon layer is deposited via LPCVD procedures, at a temperature between about 500° to 700° C., to a thickness between about 500 to 2000 Angstroms.

11. The method of claim 1, wherein said polysilicon spacers are formed on the exterior sides of said silicon oxide spacers, overlying said first silicon nitride layer, and polysilicon spacers are formed on the interior sides of said silicon oxide spacers, overlying said silicon oxide plugs, via anisotropic RIE procedures, using $Cl_2$ as an etchant, with the height of said polysilicon spacers between about 4000 to 8000 Angstroms.

12. The method of claim 1, wherein said silicon oxide spacers, said silicon oxide plugs, and said polysilicon spacers, overlying said silicon oxide plugs, are removed using a wet buffered, or dilute, hydrofluoric acid solution, or are removed using a dry vapor, hydrofluoric acid procedure.

13. The method of claim 1, wherein said dielectric layer is ONO, at an equivalent silicon dioxide thickness between about 40 to 80 Angstroms, created by an initial thermal oxidation to form a silicon oxide layer, between about 10 to 50 Angstroms, followed by a deposition of silicon nitride, to a thickness between about 10 to 20 Angstroms, and thermal oxidation of said silicon nitride layer, creating a silicon oxynitride layer, on the underlying, said silicon oxide layer.

14. The method of claim 1, wherein said dielectric layer is $Ta_2O_5$, obtained via r.f. sputtering techniques, at a thickness between about 10 to 100 Angstroms.

15. The method of claim 1, wherein said fourth polysilicon layer, used for creation of said plate electrode of said STC structure, is deposited using LPCVD procedures, at a temperature between about 500° to 700° C., to a thickness between about 1000 to 2000 Angstroms.

16. A method of fabricating a stacked capacitor structure, (STC), for a DRAM device, in which the surface area of the storage node electrode is increased via use of a storage node electrode configuration, consisting of a flat, lower polysilicon shape, used for contact to an underlying transistor region, and of an upper polysilicon shape of polysilicon spacers, protruding above the top surface of said flat, lower polysilicon shape, comprising the steps of:

depositing a first silicon oxide layer on an underlying transistor structure, of said DRAM device;

depositing a first silicon nitride layer on said first silicon oxide layer;

opening a contact hole in said first silicon nitride layer, and in said first silicon oxide layer, to expose top surface of said underlying transistor region;

depositing a first polysilicon layer on top surface of said first silicon nitride layer, and on said top surface of said underlying transistor region, exposed in said contact hole;

depositing a second silicon nitride layer on said first polysilicon layer;

patterning to create an electrode opening in said second silicon nitride layer, and into between about 2000 to 6000 Angstroms of a top portion of said first polysilicon layer;

depositing a second silicon oxide layer on top surface of said second nitride layer, and on exposed surfaces of said electrode opening;

anisotropic etching of said second silicon oxide layer to form silicon oxide spacers on sides of said electrode opening;

thermal oxidation of said first polysilicon layer, exposed in said electrode opening, to form silicon oxide plug, between said silicon oxide spacers;

removal of said second silicon nitride layer from the top surface of said first polysilicon layer, exposing said first polysilicon layer in regions not covered by said silicon oxide spacers, or by said silicon oxide plug;

anisotropic etching of said first polysilicon layer, in regions not covered by said silicon oxide spacers, or by said silicon oxide plugs, creating said flat, lower polysilicon shape, of said storage node electrode, with said silicon oxide spacers, protruding above the top surface of said flat, lower polysilicon shape, and with said silicon oxide plug, on said flat, lower polysilicon shape, between said silicon oxide spacers;

depositing a second polysilicon layer on said silicon oxide spacers, and on said silicon oxide plugs, overlying said flat, lower polysilicon shape, and on said second silicon nitride layer, between said flat, lower polysilicon shapes;

anisotropic etching of said second polysilicon layer to create polysilicon spacers, on the exterior sides of said silicon oxide spacers, overlying said first silicon nitride layer, and creating polysilicon spacers, on the interior sides of said silicon oxide spacers, overlying said silicon oxide plugs;

removal of said silicon oxide spacers, and of said silicon oxide plugs, including removal of said polysilicon spacers residing on said silicon oxide plugs, resulting in formation of said upper polysilicon shape, of said storage node electrode, of said polysilicon spacers, on the sides of said flat, lower polysilicon shape, and protruding above the top surface of said flat, lower polysilicon shape;

forming a dielectric layer on top surface of said storage node electrode;

depositing a third polysilicon layer on said dielectric layer; and patterning of said third polysilicon layer to form plate electrode, of said STC structure.

17. The method of claim 16, wherein said first polysilicon layer is obtained via LPCVD procedures, at a temperature between about 500° to 700° C., to a thickness between about 4000 to 8000 Angstroms.

18. The method of claim 16, wherein said second silicon nitride layer is deposited using LPCVD or PECVD procedures, at a temperature between about 700° to 750° C., to a thickness between about 500 to 1500 Angstroms.

19. The method of claim 16, wherein said electrode opening is formed via RIE procedures of said second silicon nitride layer using $CHF_3$ as an etchant, and then using $Cl_2$ as an etchant to remove between about 2000 to 6000 Angstroms of said first polysilicon layer, via RIE procedures.

20. The method of claim 16, wherein said second silicon oxide layer is deposited using LPCVD or PECVD procedures, at a temperature between about 700° to 750° C., to a thickness between about 800 to 2500 Angstroms.

21. The method of claim 16, wherein said silicon oxide spacers are formed via anisotropic RIE procedures of said second silicon oxide layer using $CHF_3$ as an etchant.

22. The method of claim 16, wherein said silicon oxide plug is formed via thermal oxidation of said first polysilicon layer in an oxygen-steam ambient, at a temperature between about 800° to 900° C., to a thickness between about 300 to 1000 Angstroms.

23. The method of claim 16, wherein said second silicon nitride layer is removed via hot phosphoric acid, at a temperature between about 140° to 180° C.

24. The method of claim 16, wherein said flat, lower polysilicon shape, is formed via etching of said first polysilicon layer via anisotropic, RIE procedures, using $Cl_2$ as an etchant.

25. The method of claim 16, wherein said second polysilicon layer is deposited using LPCVD procedures, at a temperature between about 500° to 700° C., to a thickness between about 500 to 2000 Angstroms.

26. The method of claim 16, wherein said polysilicon spacers are formed on the sides of said silicon oxide spacers, using $Cl_2$ as an etchant, with the height of said polysilicon spacers between about 4000 to 8000 Angstroms.

27. The method of claim 16, wherein said silicon oxide spacers, and said silicon oxide plugs, are removed using a wet buffered, or dilute, hydrofluoric acid solution, or removed using a dry vapor, hydrofluoric acid procedure.

28. The method of claim 16, wherein said dielectric layer is ONO, with an equivalent silicon oxide thickness between about 40 to 80 Angstroms, created by growing a thin silicon oxide layer on said storage node electrode, at a thickness between about 10 to 50 Angstroms, depositing between about 10 to 20 Angstroms of a silicon nitride layer, and oxidizing said silicon nitride layer to from a silicon oxynitride layer on said thin silicon oxide layer.

29. The method of claim 16, wherein said thin dielectric layer is $Ta_2O_5$, deposited using r.f. sputtering procedures, to a thickness between about 10 to 100 Angstroms.

30. The method of claim 16, wherein said third polysilicon layer is deposited using LPCVD procedures, at a temperature between about 500° to 700° C., to a thickness between about 1000 to 2000 Angstroms.

31. The method of claim 16, wherein said plate electrode is created via RIE of said second polysilicon layer, using $Cl_2$ as an etchant.

* * * * *